United States Patent [19]

Nguyen et al.

[11] Patent Number: 5,786,720

[45] Date of Patent: Jul. 28, 1998

[54] 5 VOLT CMOS DRIVER CIRCUIT FOR DRIVING 3.3 VOLT LINE

[75] Inventors: Trung Nguyen, San Jose; Dien Ngo, Santa Clara, both of Calif.

[73] Assignee: LSI Logic Corporation, Milpitas, Calif.

[21] Appl. No.: 310,621

[22] Filed: Sep. 22, 1994

[51] Int. Cl.⁶ .................................................. H03K 5/08
[52] U.S. Cl. ........................... 327/321; 327/112; 327/331; 327/391; 327/541
[58] Field of Search .................... 327/538, 57, 86, 327/108, 112, 541, 309, 310, 314, 318–321, 324, 325, 331, 109, 427, 434, 437, 389, 391; 326/62, 30, 128, 126

[56] References Cited

U.S. PATENT DOCUMENTS

| | | | |
|---|---|---|---|
| 3,868,517 | 2/1975 | Schoeff | 327/77 |
| 3,979,607 | 9/1976 | Beelitz et al. | 327/310 |
| 4,065,678 | 12/1977 | Reese et al. | 327/112 |
| 4,093,909 | 6/1978 | Watrous et al. | 323/303 |
| 4,347,476 | 8/1982 | Tam | 323/313 |
| 4,527,077 | 7/1985 | Higuchi et al. | 326/33 |
| 4,609,833 | 9/1986 | Guterman | 307/297 |
| 4,622,482 | 11/1986 | Ganger | 327/427 |
| 4,631,429 | 12/1986 | Riebeek | 307/490 |
| 4,649,291 | 3/1987 | Konishi | 327/541 |
| 4,668,875 | 5/1987 | Miyazaki et al. | 307/106 |
| 4,692,689 | 9/1987 | Takamae | 323/313 |
| 4,701,643 | 10/1987 | Laude et al. | 307/450 |
| 4,782,250 | 11/1988 | Adams et al. | 327/108 |
| 4,788,455 | 11/1988 | Mori et al. | 327/537 |
| 4,792,706 | 12/1988 | Ovens et al. | 307/455 |
| 4,812,735 | 3/1989 | Sawada et al. | 323/313 |
| 4,820,937 | 4/1989 | Hsieh | 307/475 |
| 4,845,388 | 7/1989 | Amatangelo | 307/475 |
| 4,890,010 | 12/1989 | Neudeck et al. | 327/108 |
| 4,952,818 | 8/1990 | Erdelyi et al. | 307/270 |
| 5,021,691 | 6/1991 | Saito | 327/543 |
| 5,097,303 | 3/1992 | Taguchi | 365/149 |
| 5,151,619 | 9/1992 | Austin et al. | 326/86 |
| 5,153,452 | 10/1992 | Iwamura et al. | 327/541 |
| 5,157,635 | 10/1992 | Ellis et al. | 365/230.06 |
| 5,160,855 | 11/1992 | Dobberpuhl | 327/108 |
| 5,182,468 | 1/1993 | Erdelyi et al. | 327/321 |
| 5,184,031 | 2/1993 | Hayakawa et al. | 327/544 |
| 5,212,440 | 5/1993 | Waller | 323/313 |
| 5,248,907 | 9/1993 | Lin et al. | 326/33 |
| 5,319,259 | 6/1994 | Merrill | 307/443 |
| 5,321,319 | 6/1994 | Mahmood | 327/537 |
| 5,369,317 | 11/1994 | Casper et al. | 326/21 |
| 5,420,527 | 5/1995 | Naber | 326/32 |

OTHER PUBLICATIONS

Martin, Brian C.; *Tips for Straddling the 3–V to 5V Fence*; Electronic Design; Apr. 4, 1994, pp. 67–73.

*Primary Examiner*—Kenneth B. Wells
*Attorney, Agent, or Firm*—Oppenheimer Wolff & Donnelly LLP

[57] ABSTRACT

A driver circuit that is powered by a power supply voltage has an output terminal, and includes a pull-up transistor for pulling the output terminal up toward the power supply voltage. A voltage divider that is connected across the power supply voltage has a tap connected in circuit to an input of the pull-up transistor and includes variable resistance elements whose resistance varies together with a threshold voltage of the pull-up transistor for limiting a voltage at the output terminal to within a predetermined range that is lower than the power supply voltage.

7 Claims, 3 Drawing Sheets

5,786,720

5 VOLT CMOS DRIVER CIRCUIT FOR DRIVING 3.3 VOLT LINE

BACKGROUND OF THE INVENTION

1. Field of the Invention

The present invention generally relates to the art of microelectronic integrated circuits, and more specifically to a CMOS driver circuit that is powered by a relatively high supply voltage of, for example, 5 V, and is capable of driving devices that have inputs for receiving signals at a relatively lower voltage of, for example, 3 V.

2. Description of the Related Art

Continuous advancements in microelectronic integrated circuit fabrication technology enable the geometries of circuit devices to be progressively reduced so that more devices can fit on a single integrated circuit chip. However, certain types of devices are more susceptible to size reduction than other devices. Generally, the geometries of memory circuits are being reduced at a faster rate than are the geometries of logic circuits that are connected to the memory circuits.

Transistor-Transistor-Logic (TTL) devices are conventionally powered from 5 volt power supplies. However, a problem is encountered in attempting to power memory circuits having smaller feature sizes from 5 volt power supplies. This is because the upper limit of gate oxide field strength, for the case of silicon dioxide gates, is about 3 MV per centimeter. The maximum allowable voltage across a gate oxide layer of about 150 angstrom thickness is therefore approximately 4 V. If a 5 volt signal is applied to the gate of a small geometry CMOS memory device, the gate oxide can break down and the device can be destroyed. If power supply of receiving device is 3 V, it requires an input signal not exceeding 3.45 V. Any input >3.45 V may turn on the protection diode of the receiving device which may cause leakage current.

For this reason, CMOS memory and other devices are being designed for operation with reduced voltage power supplies, a common voltage at the present state of the art being 3.3 V. However, high voltage TTL logic devices must be operatively connected to low voltage CMOS memories and other devices. Often, these devices must be connected to a common input/output line.

If no precautions are taken, a 5 volt TTL level signal applied to a line to which a device having a 3 volt logically high input level is connected can cause destruction of the device due to the gate oxide breakdown effect discussed above.

For this reason, output drivers that are powered by 5 V power supplies and must apply output signals to a 3.3 V device are provided with means for limiting the logically high output voltage to a maximum level of approximately 3.45 V. However, such prior art output drivers are disadvantageous in that they generally require an additional low voltage power supply to produce the reduced voltage. The provision of an additional power supply is undesirable from the standpoints of circuit complexity and cost.

SUMMARY OF THE INVENTION

It is an object of the present invention to provide a driver circuit that is powered by a relatively high supply voltage of, for example 5 V, and is capable of producing an output voltage having its maximum value limited to a relatively lower value on the order of 3 V for driving a low voltage device.

More specifically, a driver circuit of the present invention is powered by a power supply voltage of, for example 5 V, has an output terminal, and includes a pull-up transistor for pulling the output terminal up toward the power supply voltage.

A voltage divider that is connected across the power supply voltage has a tap connected in circuit to an input of the pull-up transistor and includes variable resistance elements whose resistance varies together with a threshold voltage of the pull-up transistor for limiting a voltage at the output terminal to within a predetermined range centered on, for example 3 V, that is lower than the power supply voltage.

The present driver circuit does not require an additional low voltage power supply as do comparable prior art drivers.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
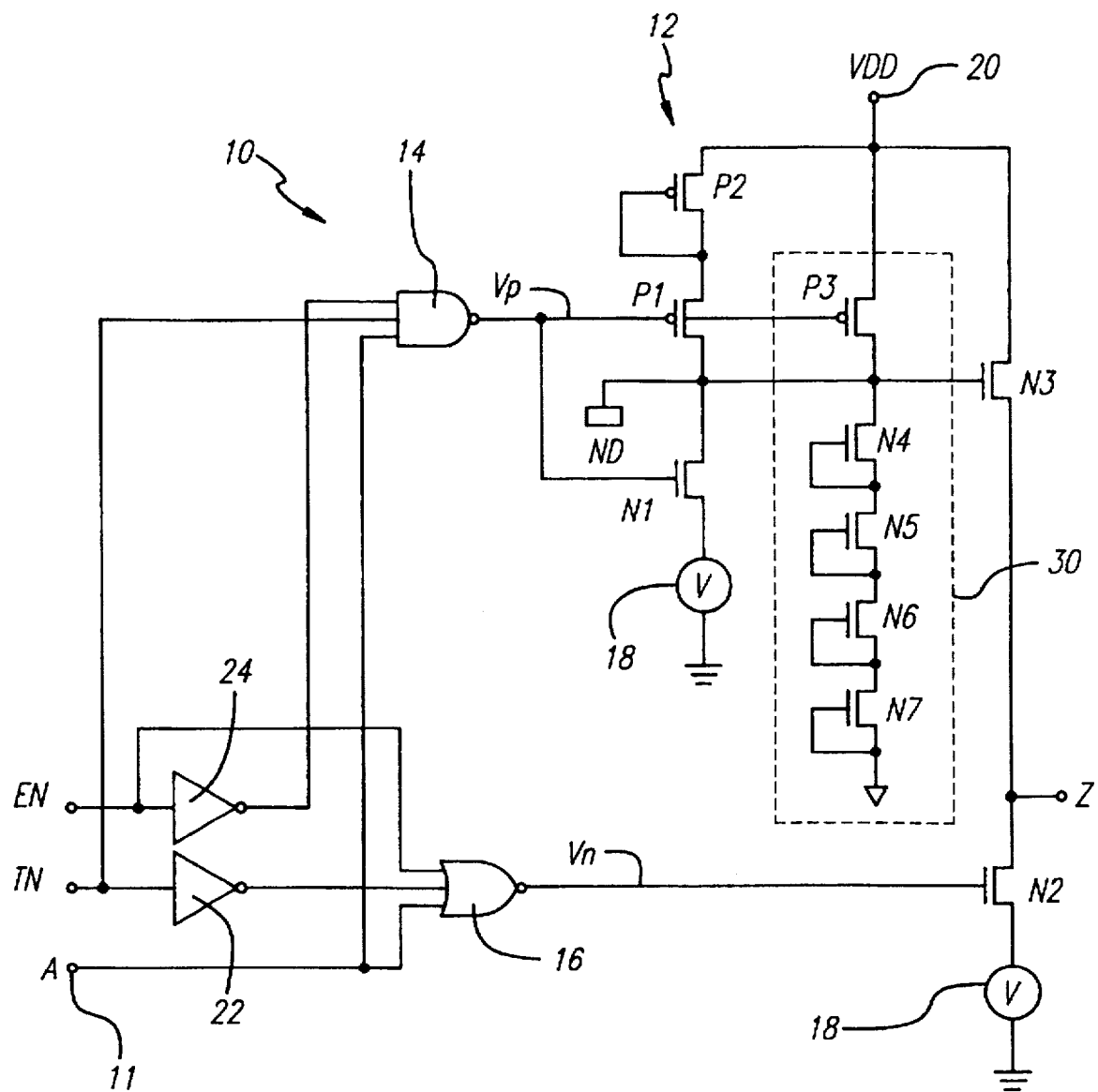
FIG. 1 is an electrical schematic diagram illustrating a CMOS driver circuit embodying the present invention.

A CMOS driver circuit 10 embodying the present invention is illustrated in FIG. 1 and comprises a pre-driver 12. The predriver 12 comprises a NAND gate 14, a NOR gate 16, inverters 22 and 24, PMOS transistors P1 and P2, and an NMOS transistor N1. An input signal A is applied to an input terminal 11, and therefrom to inputs of the NAND gate 14 and the NOR gate 16 of the pre-driver 12.

The output of the NAND gate 14 is connected to the gates of the PMOS pull-up transistor P1 and the NMOS pull-down transistor N1 which constitute an inverter of the pre-driver 12. A power supply voltage VDD is applied to the circuit 10 across a first power supply terminal 18, in this case ground, and a second power supply terminal 20 which receives the voltage VDD.

The source of the transistor P1 is connected through a diode-connected PMOS transistor P2 to the terminal 20, whereas the source of the transistor N1 is connected to the terminal 18. The drain of the transistor P1 is connected to the drain of the transistor N1.

A low logic enable signal TN is applied to an input of the NAND gate 14, and also through the inverter 22 to an input of the NOR gate 16. A high level enable signal EN is applied to an input of the NOR gate 16, and also through the inverter 24 to an input of the NAND gate 14.

The output of the NOR gate 16 is connected to the gate of an NMOS pull-down transistor N2, the source of which is connected to the terminal 18. The drain of the transistor N2 is connected to the source of an NMOS pull-up transistor N3, the drain of which is connected to the terminal 20. The junction of the transistors N2 and N3 constitutes an output terminal Z. The junction of the transistors P1 and N1 constitutes a node ND which is connected to the gate of the pull-up transistor N3 and constitutes an input for the transistor N3.

The pre-driver 12 produces two signals $V_p$ and $V_n$ which appear at the outputs of the NAND gate 14 and the NOR gate

3

16 respectively. The signal $V_p$ is applied to the gates of the transistors P1 and N1, whereas the signal $V_n$ is applied to the gate of the pull-down transistor N2.

The circuit 10 further comprises a voltage divider 30 which will be described in detail below. The operation of the circuit 10 will first be described assuming that the divider 30 is omitted.

The circuit 10 is controlled to operate in a normal drive mode by making the enable signal EN low and the negative logic enable signal TN high. This will cause the NOR gate 16 and the NAND gate 14 to function as inverters. If the input signal A is high, the signals $V_p$ and $V_n$ that are applied to the gates of the transistors P1, N1 and N2 will be low, thereby turning on the pull-up transistor P1 and turning off the pull-down transistors N1 and N2.

The transistor P1 pulls the voltage at the node ND high, thereby turning on the pull-up transistor N3 to pull up the terminal Z. The output signal at the terminal Z is therefore high.

If the input signal A is low, the signals $V_p$ and $V_n$ at the gates of the transistors P1, N1 and N2 will be high, thereby turning on the transistors N1 and N2 and turning off the transistor P1. The voltage at the node ND will be pulled low by the transistor N1, thereby turning off the pull-up transistor N3. The high signal $V_n$ at the gate of the transistor N2 turns on the transistor N2 to pull down the voltage at the terminal Z. The output signal at the terminal Z is therefore low (ground).

For tristate or high impedance mode operation, the enable signal EN is made high and the negative logic enable signal TN is made low. The low signal EN causes the NAND gate 14 to produce a high output, and causes the NOR gate 16 to produce a low output, such that the signal $V_p$ is high, the voltage at the node ND is low and the signal $V_3$ is low. This causes the pull-up and pull-down transistors N3 and N2 respectively to be turned off and appear transparent to an external device connected to the terminal Z.

The diode-connected transistor P2 is provided to drop the voltage at the source of the PMOS pull-up transistor P1 to $VDD-V_T$, where $V_T$ is the threshold voltage of the transistor P2 and has a nominal value of 0.7 V. Where the power supply voltage VDD=5 V, the voltage at the source of the transistor P1 is 5 V−0.7 V=4.3 V.

When the signal VP is low, the pull-up transistor P1 is turned on to pass the 4.3 V signal at its source to the node ND.

A similar threshold voltage drop occurs across the pull-up transistor N3. With the gate of the transistor N3 at 4.3 V, the voltage at the source of the transistor N3 and thereby at the output terminal Z is 4.3 V−0.7 V=3.6 V. When VDD=5.25 V, output Z=3.85 V. This 3.6 V may turn on the diode protection on a 3 V receiving part.

Although a 3.6 V output signal can generally be applied to an input of a low voltage CMOS device without causing damage since the maximum voltage limit is on the order of approximately 4.0 V, it is generally desirable to limit the nominal output voltage to 3.45 V. One reason for this is to allow a margin for error in practical circuits in which the threshold voltages of the CMOS transistors can vary from their optimal values.

More specifically, there are a number of processing parameters in microelectronic circuit fabrication that can result in process factor variations, i.e. the relative strengths of the NMOS and PMOS transistors in CMOS circuits. Process factor variations generally result in the NMOS and PMOS transistors having different threshold voltages. Another source of variation is (normally) ±5% from 5 V power supply. Such variations can cause the maximum output voltage of the circuit 10 as described above to undesirably approach or exceed the 4 V damage limit.

More specifically, the output voltage at the terminal Z for a logically high output is equal to the supply voltage VDD minus two threshold drops (one across the PMOS transistor P1 and one across the NMOS transistor N3). For the nominal case in which the threshold voltage is 0.7 V for both NMOS and PMOS transistors, the logically high output voltage is 3.6 V as described above.

If, however, the NMOS and PMOS transistors in the circuit 10 are both very strong and have low threshold voltages of 0.5 V, the logically high output voltage increases to 4.0 V. This can damage low voltage devices connected to the output terminal Z. On the other hand, if the NMOS and PMOS devices are both very weak and have threshold voltages of 0.9 V, the logically high output voltage becomes 3.2 V.

In accordance with the present invention, the voltage divider 30 is provided to adjust and limit the voltage at the node ND to a value such that the output voltage at the terminal Z lies within a range of preferably 2.45 V to 3.45 V. As described above, 3.45 V is the maximum output voltage that will preclude damage to low voltage devices. 2.45 V is the minimum logically high voltage for driving a TTL device. Thus, a logically high output voltage of between 2.45 V and 3.45 V will drive both low voltage CMOS and TTL devices having inputs connected to the output terminal Z.

The voltage divider 30 comprises a PMOS transistor P3 that is connected between the node ND and the supply voltage VDD at the terminal 20. The gate of the transistor P3 is connected to the gate of the transistor P1 to receive the signal $V_p$. The voltage divider 30 further comprises a string of diode-connected NMOS transistors N4, N5, N6 and N7 that are connected in series with each other between the node ND and ground at the terminal 18.

It will be noted that the transistors N1, P1 and P2 can also be considered part of the voltage divider 30 since, in addition to their primary functions, their individual threshold voltages and resistances affect the voltage at the node ND.

The transistors P3 and N4 to N7 are variable resistance elements whose resistance varies in accordance with the process factor of the circuit 10 and thereby the threshold voltages of the NMOS and PMOS transistors thereof.

The gate lengths and widths of the transistors P3 and N4 to N7, as well as the transistors N1, P1 and P2 are selected such that the resistances of these transistors and thereby the voltage divider 30 produce a logically high signal at the output terminal having a voltage of approximately 3.0 V for the case in which the NMOS and PMOS transistors both have a nominal or normal threshold voltage of approximately 0.7 V. The corresponding voltage at the node ND is 3.0 V+0.7 V=3.7 V.

The transistors N4 to N7 are designed to pull the node ND down from 4.3 V (as described above for the case in which the voltage divider 30 is omitted) to 3.7 V for a nominal CMOS process factor. These transistors are also designed to maintain the voltage at the output terminal Z between 2.45 V and 3.45 V for the entire possible range of process factor variation, in which the NMOS and PMOS transistors can have either the same or different threshold voltages ranging from 0.5 V (strong case) to 0.9 V (weak case).

For the extreme case in which both the NMOS and PMOS transistors have threshold voltages of 0.5 V, the voltage divider 30 will maintain the voltage at the node ND at 3.45 V+0.5 V=3.95 V. The transistors N4 to N7 turn on relatively hard, presenting a relatively low resistance between the node ND and ground which prevents the voltage at the node ND from exceeding 3.95 V.

In the opposite extreme case in which both the NMOS and PMOS transistors have threshold voltages of 0.9 V, the transistors N4 to N7 turn on relatively weakly, presenting a relatively high resistance between the node ND and ground, thereby preventing the voltage at the node ND from dropping below 2.45 V+0.9 V 3.35 V.

In the manner described, the voltage divider 30 maintains the logically high voltage at the node ND between 3.35 V and 3.95 V, and the logically high voltage at the output terminal Z between 2.45 V and 3.45 V for the entire process factor and threshold voltage variation range of the circuit 10.

Due to the interaction between the numerous elements in the circuit 10, the gate lengths and widths of the individual transistors are preferably selected using a commercially available computer simulation program such as SPICE. The following TABLE tabulates the gate lengths and widths which have been determined to produce the results described above. As a general rule, increasing the width to length ratio makes a transistor stronger, such that it will turn on harder and present lower resistance.

| TRANSISTOR | GATE WIDTH (MICROMETERS) | GATE LENGTH (MICROMETERS) |
|---|---|---|
| P1 | 40 | 1.1 |
| P2 | 140 | 1.1 |
| P3 | 6 | 7 |
| N1 | 40 | 1 |
| N2 | 45 | 1 |
| N3 | 120 | 1 |
| N4–N7 | 20 | 1 |

The transistor P3 is relatively weak, and is provided to "fine tune" the voltage divider 30. The transistor P3 can be omitted if such fine tuning is not required in order to reduce the number of transistors in the circuit 10.

Figure 2:
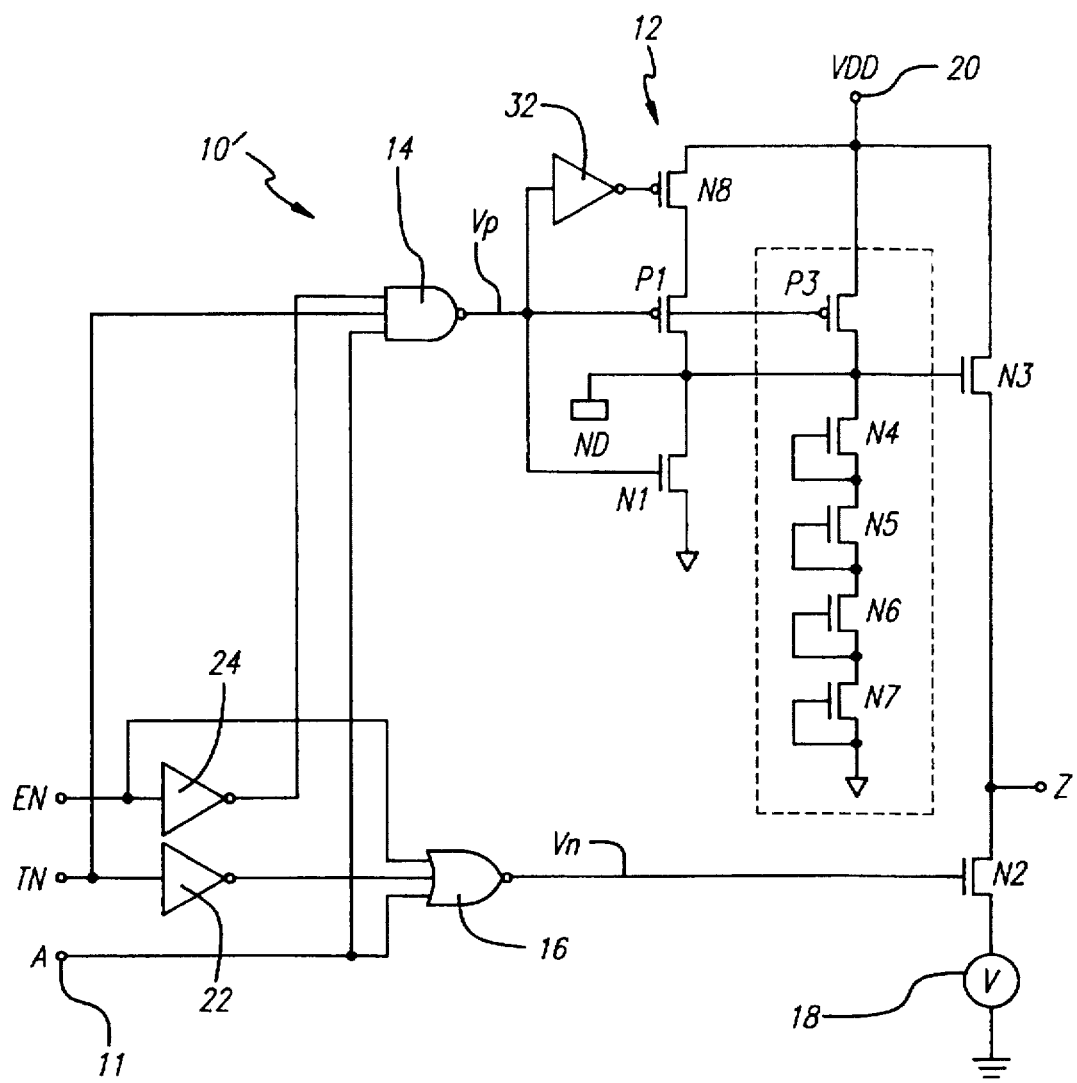
FIG. 2 is similar to FIG. 1, but illustrates another driver circuit of the invention.

FIG. 2 illustrates a CMOS driver circuit 10' which differs from the circuit 10 in that the PMOS transistors P1 and P2 are replaced with a single NMOS pull-up transistor N8. An inverter 32 is provided to invert the input to the pull-up transistor N8 relative to the pull-down transistor N1.

Figure 3:
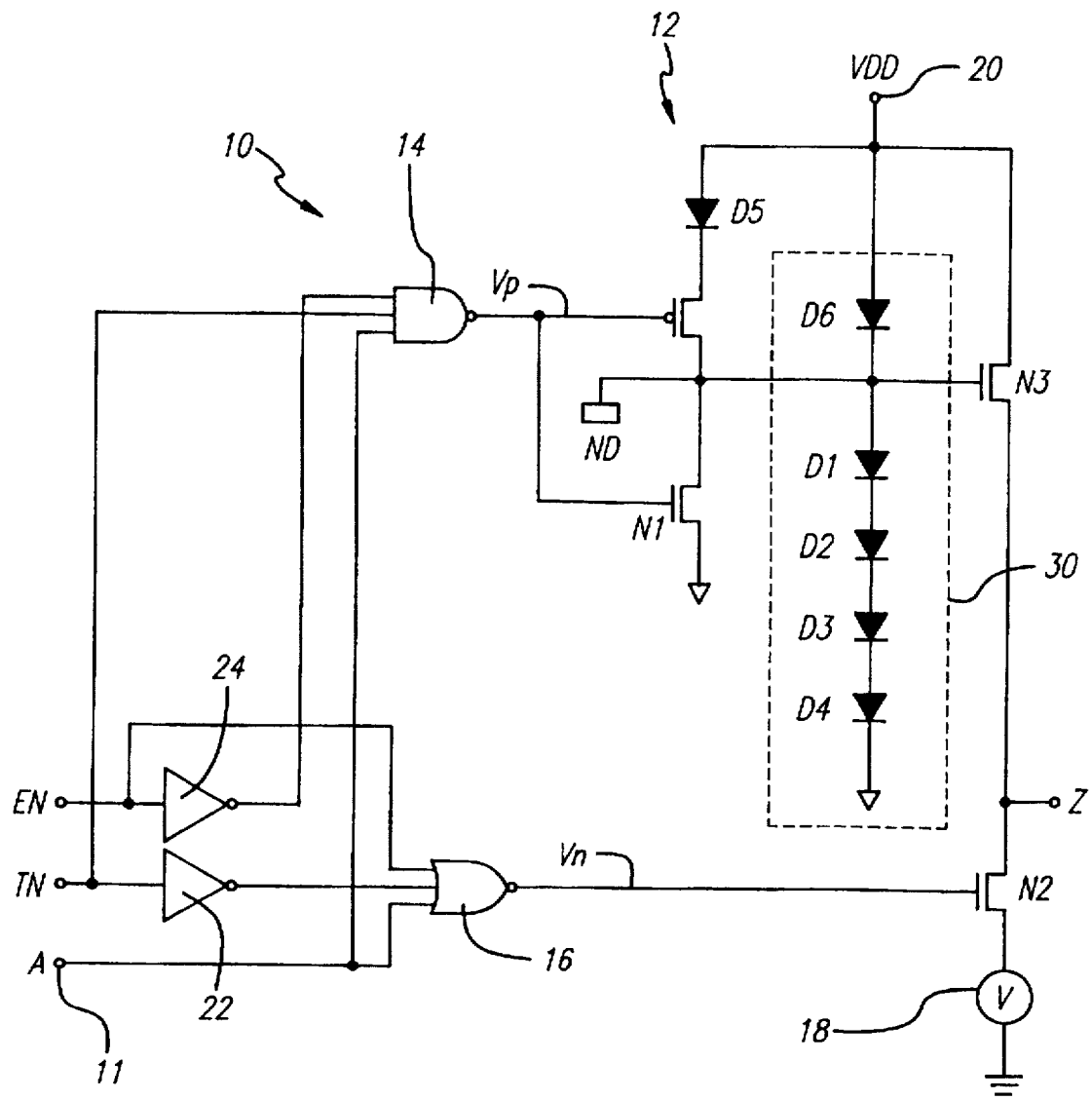
FIG. 3 illustrates yet another driver circuit of the invention.

FIG. 3 illustrates another CMOS driver circuit 10" in which the transistors N4 to N7, P2 and P3 are replaced by diodes D1 to D6 respectively. The diodes D1 to D6 are designed to have resistances that vary together with the threshold voltages of the NMOS and PMOS transistors in the circuit 10" in a manner similar to that described above for the circuit 10.

In summary, the present invention provides a driver circuit that is powered by a relatively high supply voltage of, for example 5 V, and is capable of producing an output voltage having its maximum value limited to a relatively lower value on the order of 3 V for driving a low voltage device. This is accomplished without an additional low voltage power supply as is required in comparable prior art drivers.

Various modifications will become possible for those skilled in the art after receiving the teachings of the present disclosure without departing from the scope thereof.

We claim:

1. In an integrated driver circuit that is powered by a nominal power supply voltage having a voltage level varying within a range of about ±5%, and which also includes circuit elements having variable functional characteristics dependent upon process variables effective during formation of said integrated driver circuit, said driver circuit having an output terminal at which is delivered an output voltage limited within a range lower than said nominal power supply voltage despite said variation of said supply voltage and despite said variation in functional characteristics of said circuit elements, the combination in said integrated driver circuit comprising:

a field-effect pull-up transistor for pulling the output terminal up toward the power supply voltage, said field-effect pull-up transistor having a threshold voltage varying in dependence upon said process variables;

a voltage divider connected across the power supply voltage, having a tap connected to the input of the pull-up transistor, and including variable resistance elements whose resistances vary in dependence upon said process variables together with said threshold voltage of the field-effect pull-up transistor for limiting a voltage at the output terminal to within a predetermined range that is lower than the power supply voltage;

an input terminal;

a pre-driver connected between said input terminal and a gate input of said field-effect pull-up transistor, said driver including a respective pull-up transistor;

a pull-up transistor that constitutes one of said variable resistance elements of the voltage divider;

said pre-driver also having a pull down transistor:

said pull-up transistor of the pre-driver being a PMOS transistor; and the pre-driver further including a diode-connected PMOS transistor connected in series with the pull-up transistor of the pre-driver;

each of said pull-up transistor of said pre-driver, said pull-down transistor of said pre-driver, said pull-up transistor of said variable resistance elements, and said diode-connected PMOS transistor also having functional characteristics including threshold voltage and resistance which vary in dependence upon said process variables along with said threshold voltage of said field-effect pull-up transistor to maintain said output voltage within said range.

2. In a CMOS integrated driver circuit that is powered by a nominal power supply voltage having a voltage variation within a range of about ±5%, and also has circuit elements having functional characteristics varying dependent upon process variables effective during formation of said integrated driver circuit, said driver circuit having an output terminal, the combination in said CMOS integrated driver circuit comprising:

an input terminal;

a field-effect pull-up transistor connected between the power supply voltage and the output terminal for pulling the output terminal up toward said power supply voltage, the field-effect pull-up transistor having an input and having a threshold voltage dependent upon said process variables effective during formation of said CMOS integrated driver circuit;

a pre-driver including a pull-up transistor and a pull-down transistor connected to the input terminal, a node being defined between the pull-up and pull-down transistors of the pre-driver and connected to the input of the field-effect pull-up transistor; and a voltage divider that is connected across said power supply voltage, has a tap connected to the input of the field-effect pull-up transistor and includes variable resistance elements whose resistances also vary dependent upon said process variables together with said threshold voltage of the field-effect pull-up transistor for limiting a voltage at said output terminal to within a predetermined range that is lower than said power supply voltage;

and further comprising:

first and second power supply terminals across which said power supply voltage is applied; in which the variable resistance elements include a PMOS element connected between said input of the field-effect pull-up transistor and said second power supply terminal and an NMOS element connected between said input of the field-effect pull-up transistor and said first power supply terminal.

3. A CMOS integrated driver circuit as in claim 2, in which the field-effect pull-up transistor is an NMOS transistor.

4. In an integrated CMOS driver circuit that is powered by a nominal power supply voltage of 5 volts varying within about ±5%, includes integrated circuit elements having variable functional characteristics dependent upon process variables experienced during formation of said integrated CMOS driver circuit and has an output terminal at which is provided a logic-high signal limited to within a range of from about 2.4 volts to about 3.5 volts despite said process variations, and despite variation of said nominal power supply voltage, the combination comprising:

an input terminal;

an NMOS pull-up transistor for pulling the output terminal up toward said power supply voltage;

a pre-driver connected between the input terminal and an input of the NMOS pull-up transistor and including a respective pull-up transistor and an NMOS pull-down transistor; and a voltage divider connected across the power supply voltage, having a tap connected to said input of the NMOS pull-up transistor, and including variable resistance elements whose resistances vary together with a threshold voltage of the NMOS pull-up transistor for limiting a voltage at the output terminal to within said predetermined range;

the pull-up transistor of the pre-driver being a PMOS transistor; and the pre-driver further including a diode-connected PMOS transistor connected in series with the PMOS pull-up transistor of the pre-driver;

each of said NMOS pull-up transistor, said PMOS pull-up transistor of said pre-driver and said NMOS pull-down transistor of said pre-driver, said variable resistance elements of said voltage divider, and said diode-connected PMOS transistor of said pre-driver having threshold voltages varying in dependence upon said process variables to limit voltage of said logic-high signal to within said range.

5. In an integrated CMOS driver circuit that is powered by a power supply voltage having a nominal voltage of about 5 volts and a voltage variation of about ±5% and which includes circuit elements having functional characteristics varying in dependence upon process variables experienced during formation of said integrated CMOS driver circuit, said CMOS integrated driver circuit having an output terminal connectable to a CMOS device and to which a logic-high voltage within a predetermined range is provided regardless of variation of said power supply voltage within nominal range and regardless of said process variations, the combination comprising:

an NMOS pull-up transistor for pulling the output terminal up toward said power supply voltage, said NMOS pull-up transistor having a threshold voltage varying in dependence upon said process variables; and a voltage divider that is connected across said power supply voltage, has a tap connected to an input of the NMOS pull-up transistor and includes variable resistance elements whose resistances vary in dependence upon said process variables together with said threshold voltage of the NMOS pull-up transistor for limiting a voltage at said output terminal to within a predetermined range that is lower than said power supply voltage;

said predetermined range being between a maximum voltage that precludes damage to the CMOS device of about 3.5 volts and a minimum logically high voltage for driving the CMOS device of about 2.4 volts;

and further comprising:

positive and negative power supply terminals across which said power supply voltage is applied; in which the variable resistance elements include a PMOS element connected between said input of the NMOS pull-up transistor and said positive power supply terminal and an NMOS element connected between said input of the NMOS pull-up transistor and said negative power supply terminal.

6. A CMOS driver circuit as in claim 5, in which the pull-up transistor of the pre-driver is a PMOS transistor.

7. A driver circuit as in claim 1, in which the predetermined range of voltage at the output terminal is about 2.4 volts to 3.5 volts.

* * * * *